United States Patent
Jeong et al.

(10) Patent No.: US 9,443,879 B2
(45) Date of Patent: Sep. 13, 2016

(54) DISPLAY SUBSTRATE AND METHOD OF MANUFACTURING THE DISPLAY SUBSTRATE

(71) Applicant: SAMSUNG DISPLAY CO., LTD., Yongin, Gyeonggi-Do (KR)

(72) Inventors: Yu-Gwang Jeong, Anyang-si (KR); Shin-Il Choi, Hwaseong-si (KR); Su-Bin Bae, Gyeongsan-si (KR); Dae-Ho Kim, Daegu (KR); Sang-Gab Kim, Seoul (KR); Jae-Neung Kim, Seoul (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 55 days.

(21) Appl. No.: 14/455,113

(22) Filed: Aug. 8, 2014

(65) Prior Publication Data
US 2015/0053989 A1    Feb. 26, 2015

(30) Foreign Application Priority Data

Aug. 21, 2013   (KR) .................... 10-2013-0098960

(51) Int. Cl.
| | |
|---|---|
| *H01L 27/12* | (2006.01) |
| *H01L 21/311* | (2006.01) |
| *H01L 21/768* | (2006.01) |

(52) U.S. Cl.
CPC ....... *H01L 27/124* (2013.01); *H01L 21/31116* (2013.01); *H01L 21/76804* (2013.01); *H01L 27/1259* (2013.01); *H01L 21/76832* (2013.01)

(58) Field of Classification Search
CPC ........... H01L 21/76805; H01L 21/311; H01L 21/76801; H01L 21/76802; H01L 21/76804
See application file for complete search history.

(56) References Cited

U.S. PATENT DOCUMENTS

| 4,495,220 A | * | 1/1985 | Wolf | ................ H01L 21/02063 |
| | | | | 204/192.37 |
| 2014/0346504 A1 | * | 11/2014 | Misaki | ................ H01L 21/0217 |
| | | | | 257/43 |

FOREIGN PATENT DOCUMENTS

| JP | 2010-141082 | 6/2010 |
| KR | 1020010091686 | 10/2001 |
| KR | 1020050073375 | 7/2005 |
| KR | 1020060135260 | 12/2006 |
| KR | 1020090022804 | 3/2009 |

* cited by examiner

*Primary Examiner* — Daniel Whalen
*Assistant Examiner* — Suberr Chi
(74) *Attorney, Agent, or Firm* — F. Chau & Associates, LLC

(57) ABSTRACT

A display substrate includes a base substrate, a common line on the base substrate, a first insulation layer covering the common line and having a first insulating material, a conductive pattern on the first insulation layer and including a source electrode and a drain electrode, a second insulation layer covering the drain electrode and the common line, and including a lower second insulation layer having a second insulating material and an upper second insulation layer having the first insulating material, a first electrode electrically connected to the drain electrode through a first contact hole in the second insulation layer, and a second electrode electrically connected to the common line through a second contact hole in the first and second insulation layers. The upper and lower second insulation layers on the drain electrode have a first hole and a second hole respectively that form the first contact hole.

10 Claims, 11 Drawing Sheets

DISPLAY SUBSTRATE AND METHOD OF MANUFACTURING THE DISPLAY SUBSTRATE

CROSS-REFERENCE TO RELATED APPLICATION

This application claims priority under 35 U.S.C. §119 to Korean Patent Application No. 10-2013-0098960, filed on Aug. 21, 2013 in the Korean Intellectual Property Office (KIPO), the disclosure of which is incorporated by reference in its entirety herein.

BACKGROUND

1. Technical Field

Exemplary embodiments of the invention relate to a display substrate and a method of manufacturing the display substrate.

2. Discussion of Related Art

A display device may include a first display substrate, a second display substrate facing the first substrate and a liquid crystal layer interposed between the first display substrate and the second display substrate.

The first display substrate may include a gate line, a data line, a switching element connected to the gate line and the data line, a gate insulation layer on a gate electrode of the switching element, a passivation layer on source/drain electrodes of the switching element to partially overlap the drain electrode, and a pixel electrode electrically connected to the switching element.

The passivation layer may be etched to form a contact hole for exposing the drain electrode. A metallic polymer may be deposited on a sidewall of an opening of a photoresist pattern for forming the contact hole to form a fence on the sidewall of the opening. Accordingly, a contact failure between the drain electrode and the pixel electrode may occur due to the fence.

SUMMARY

At least one exemplary embodiment of the invention provides a display substrate capable of improving the reliability of a display device and a method of manufacturing the display substrate.

According to an exemplary embodiment of the invention, a display substrate includes a base substrate, a common line located on the base substrate, a first insulation layer located on the base substrate to cover the common line and having a first insulating material, a conductive pattern located on the first insulation layer and including a source electrode and a drain electrode, a second insulation layer located on the first insulation layer to cover the drain electrode and the common line, and including a lower second insulation layer having a second insulating material and an upper second insulation layer having the first insulating material, a first electrode electrically connected to the drain electrode through a first contact hole in the second insulation layer, and a second electrode electrically connected to the common line through a second contact hole in the first and second insulation layers. The upper second insulation layer and the lower second insulation layer on the drain electrode have a first hole and a second hole respectively that form the first contact hole, the first hole exposes an upper end portion of the lower second insulation layer, and a sidewall of the first contact hole has a step portion.

In an exemplary embodiment, the first insulating material may include silicon nitride and the second insulating material may include silicon oxide.

In an exemplary embodiment, a sidewall of the first hole may have a first inclination angle and a sidewall of the second hole may have a second inclination angle smaller than the first inclination angle.

In an exemplary embodiment, the first hole may have a first width and the second hole may have a second width smaller than the first width.

In an exemplary embodiment, the upper second insulation layer, the lower second insulation layer and the first insulation layer on the common line may have a third hole, a fourth hole and a fifth hole respectively that form the second contact hole.

In an exemplary embodiment, a sidewall of the third hole may have a third inclination angle, a sidewall of the fourth hole may have a fourth inclination angle smaller than the third inclination angle, and a sidewall of the fifth hole may have a fifth inclination angle greater than the fourth inclination angle.

In an exemplary embodiment, the third hole may have a third width, the fourth hole may have a fourth width smaller than the third width, and the fifth hole may have a fifth width smaller than the fourth width.

According to an exemplary embodiment of the invention, a method of manufacturing a display substrate includes: forming a common line on a base substrate; forming a first insulation layer on the base substrate to cover the common line, the first insulation layer having a first insulating material; forming a conductive pattern on the first insulation layer, the conductive pattern including a source electrode and a drain electrode; forming a second insulation layer on the first insulation layer to cover the drain electrode and the common line, the second insulation layer including a lower second insulation layer having a second insulating material and an upper second insulation layer having the first insulating material; performing a first etching process on the second insulation layer over the common line and the drain electrode until the drain electrode is exposed; and performing a second etching process on the second and first insulation layers over the common line and the drain electrode to form a first contact hole exposing the drain electrode and a second contact hole exposing the common line. The etching rate of the first insulating material in the second etching process is higher than an etching rate of the first insulation material in the first etching process.

In an exemplary embodiment, the first insulating material may include silicon nitride and the second insulating material may include silicon oxide.

In an exemplary embodiment, an etch selectivity of the first insulating material with respect to the second insulating material in the second etching process may be higher than that in the first etching process.

In an exemplary embodiment, the first etching process may include an anisotropic etching process and the second etching process may include an isotropic etching process.

In an exemplary embodiment, the first and second etching processes may include a plasma ion etching process.

In an exemplary embodiment, the method may further include a third etching process for controlling sidewall profiles of the first and second contact holes.

In an exemplary embodiment, the upper second insulation layer and the lower second insulation layer on the drain electrode may have a first hole and a second hole respectively that form the first contact hole, the first hole may expose an upper end portion of the lower second insulation layer, and a sidewall of the first contact hole may have a step portion.

In an exemplary embodiment, a sidewall of the first hole may have a first inclination angle and a sidewall of the second hole may have a second inclination angle smaller than the first inclination angle.

In an exemplary embodiment, the upper second insulation layer, the lower second insulation layer and the first insulation layer on the common line may have a third hole, a fourth hole and a fifth hole respectively that form the second contact hole.

In an exemplary embodiment, a sidewall of the third hole may have a third inclination angle, a sidewall of the fourth hole may have a fourth inclination angle smaller than the third inclination angle, and a sidewall of the fifth hole may have a fifth inclination angle greater than the fourth inclination angle.

In an exemplary embodiment, the method may further include forming an organic insulation layer on the second insulation layer.

In an exemplary embodiment, the method may further include forming a first electrode electrically connected to the drain electrode through the first contact hole.

In an exemplary embodiment, the method may further include forming a second electrode electrically connected to the common line through the second contact hole.

According to an exemplary embodiment of the invention, a display substrate includes: a base substrate; a common line located on the base substrate; a first insulation layer located on the base substrate to cover the common line and having a first insulating material; a drain electrode of a transistor located on the first insulation layer; a second insulation layer located on the first insulation layer to cover the drain electrode and the common line, and including a lower second insulation layer having a second insulating material and an upper second insulation layer having the first insulating material; a first electrode electrically connected to the drain electrode through a first contact hole in the second insulation layer; and a second electrode electrically connected to the common line through a second contact hole in the first and second insulation layers, where the upper second insulation layer and the lower second insulation layer on the drain electrode have a first hole and a second hole that respectively form the first contact hole, where a width of the first hole is wider than the second hole.

According to an exemplary embodiment of the invention, multi-step etching processes are performed to form the first contact hole in the second insulation layer having a first height from the drain electrode and the second contact hole in the first and second insulation layers having a second height greater than the first height from the common line.

Further, the first etching process of the multi-step etching processes may be performed using a photoresist pattern as an etching mask to expose the drain electrode DE, and then the second etching process is performed to expose the common line CL as well as to remove the fence formed on a sidewall of an opening of the photoresist pattern during the first etching process, which may improve reliability of a display device.

BRIEF DESCRIPTION OF THE DRAWINGS

Exemplary embodiments of the invention will be more clearly understood from the following detailed description taken in conjunction with the accompanying drawings.

FIG. 1 is a plan view illustrating a display device in accordance with an exemplary embodiment of the inventive concept.

FIG. 2 is a cross-sectional view taken along the line I-I' line in FIG. 1.

FIG. 3 is a cross-sectional view illustrating the "A" portion in FIG. 2.

FIG. 4 is a cross-sectional view illustrating the "B" portion in FIG. 2

FIGS. 5 to 10C are cross-sectional views illustrating a method of manufacturing a display substrate in accordance with an exemplary embodiment of the inventive concept.

DETAILED DESCRIPTION

Hereinafter, exemplary embodiments will be explained in detail with reference to the accompanying drawings.

Figure 1:
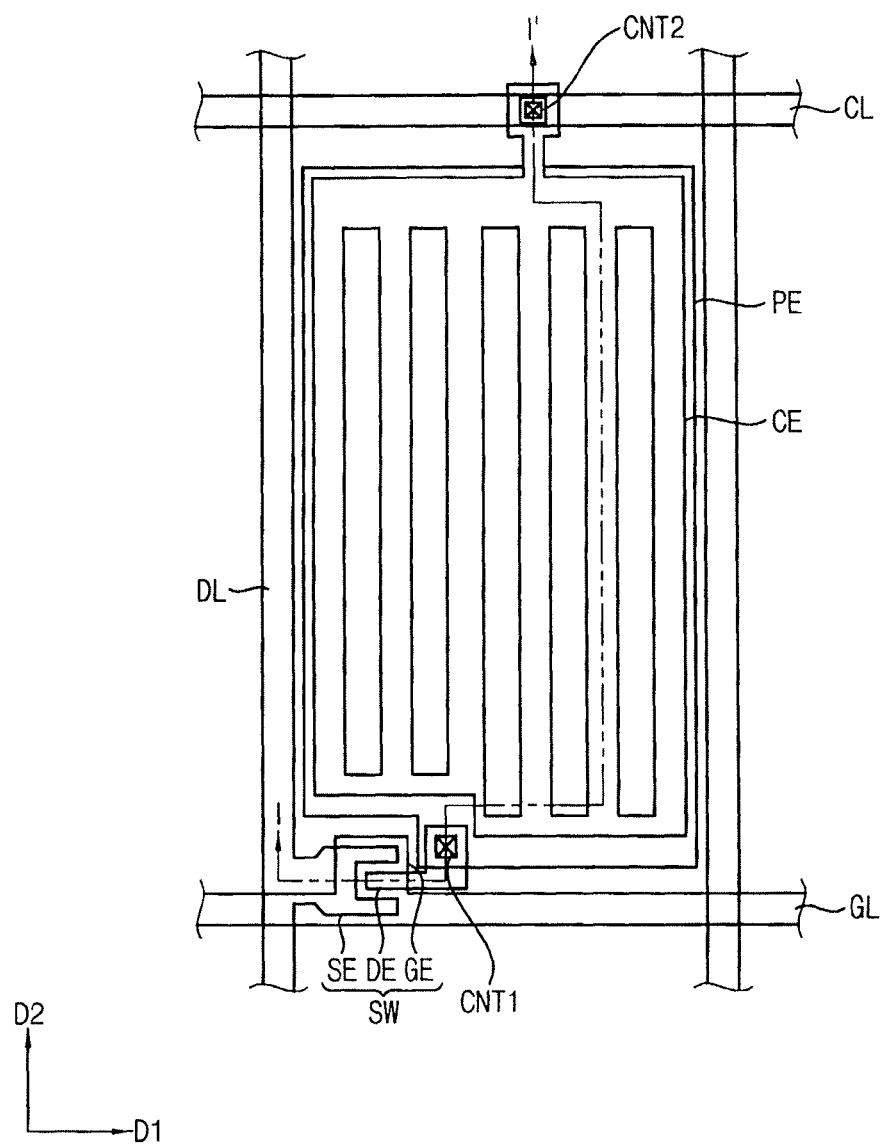
FIGS. 1 to 10C illustrate exemplary embodiments of the invention as described herein.
Figure 2:
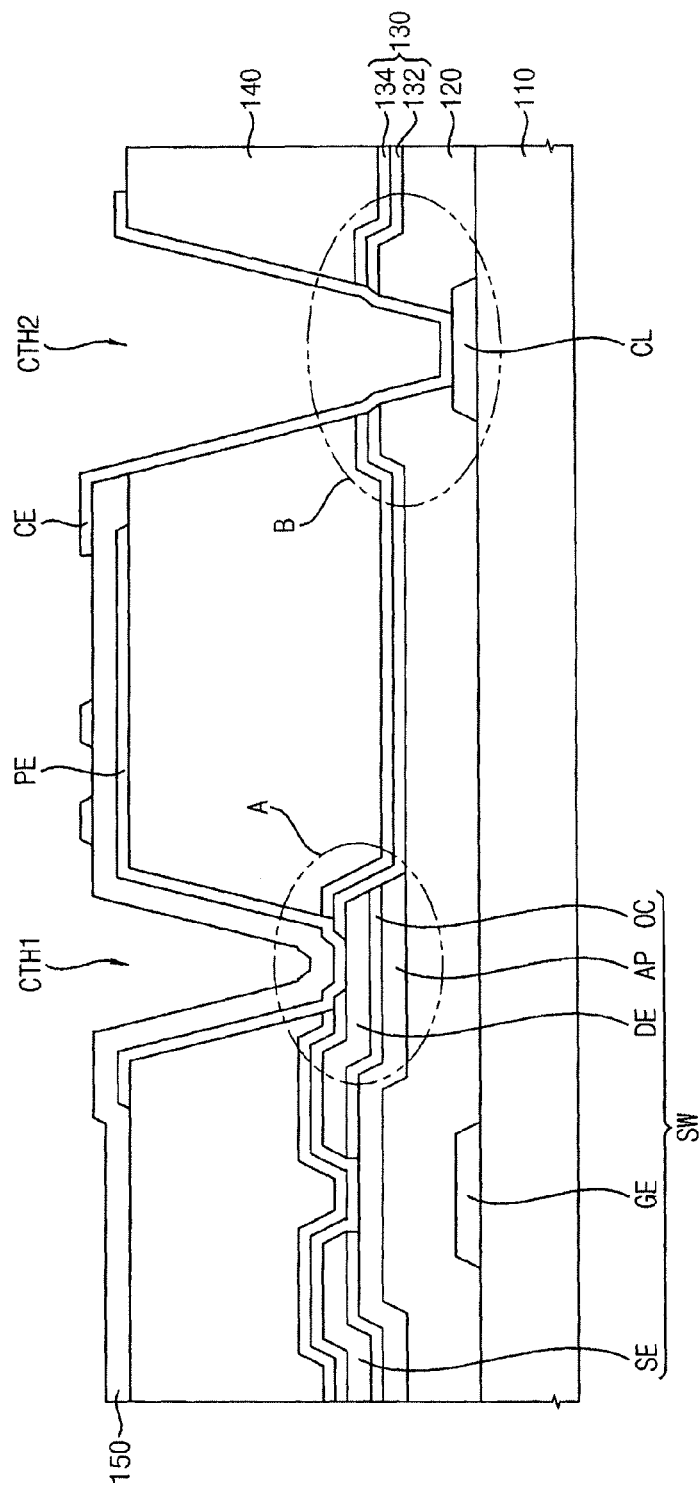
Figure 3:
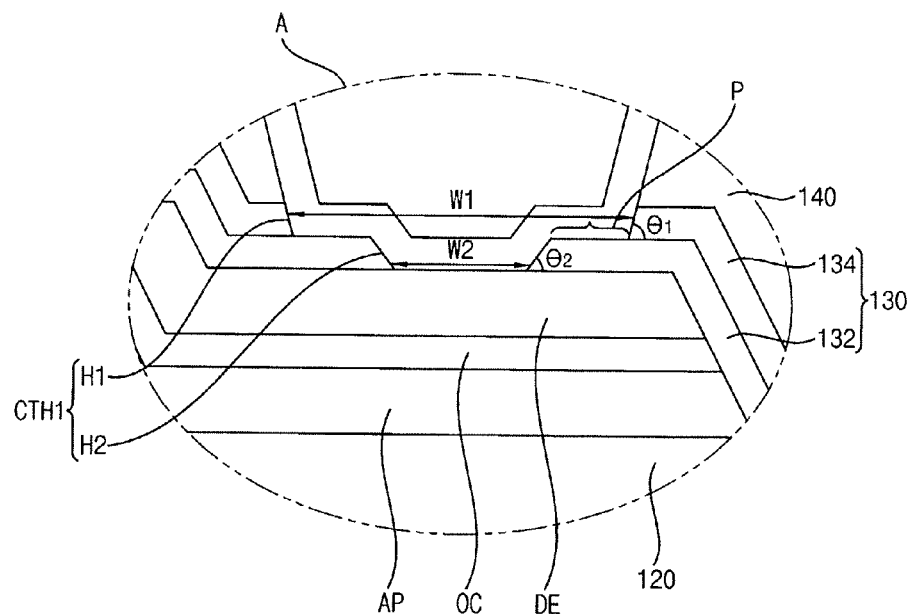
Figure 4:
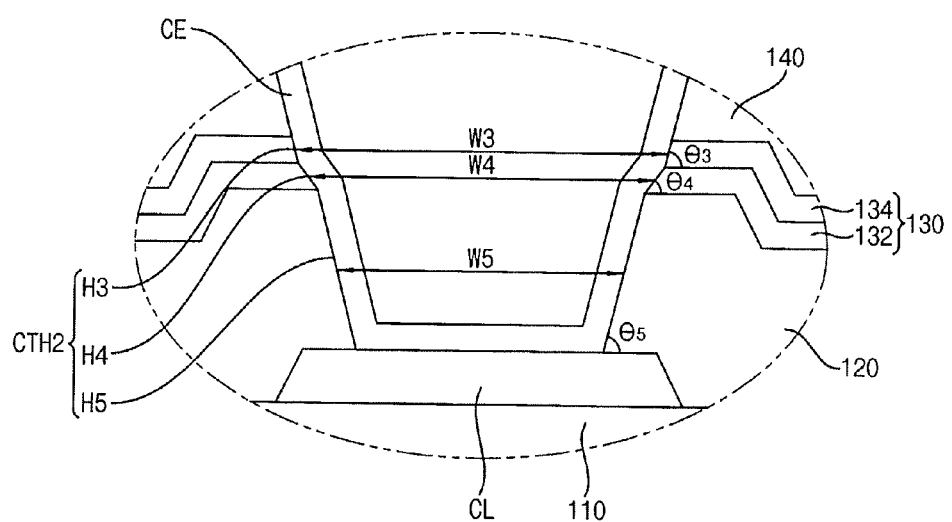

FIG. 1 is a plan view illustrating a display device in accordance with an exemplary embodiment of the inventive concept. FIG. 2 is a cross-sectional view taken along the line I-I' line in FIG. 1. FIG. 3 is a cross-sectional view illustrating the "A" portion in FIG. 2. FIG. 4 is a cross-sectional view illustrating the "B" portion in FIG. 2.

Referring to FIGS. 1 to 4, a display device 100 includes a base substrate 110, a gate line GL, a data line DL, a switching element SW, a common line CL, a pixel electrode PE, a first insulation layer 120, a second insulation layer 130, an organic insulation layer 140 and a third insulation layer 150 on the base substrate 110.

The gate line GL may extend in a first direction (D1) on the base substrate 110. The data line DL may extend in a second direction (D2) crossing the first direction (D1) on the base substrate 110.

The common line CL may extend in the first direction (D1). In an exemplary embodiment, the common line CL includes the same material as the gate line GL. A common voltage may be applied to the common line CL from an external device such as a printed circuit board including a gate driving portion mounted thereon.

The switching element SW includes the gate electrode GE, the source electrode SE and the drain electrode DE. In an exemplary embodiment, the source electrode SE and the drain electrode DE are spaced apart from each other on the gate electrode GE. The switching element SW may further include an active pattern AP and an ohmic contact layer OC that are interposed between the gate electrode GE and the source/drain electrodes SE and DE. The active pattern AP may include amorphous silicon. The ohmic contact layer OC may include amorphous silicon highly doped with n type impurities.

The first insulation layer 120 may be provided on the base substrate 110 to cover the gate line GL, the gate electrode GE and the common line CL. The gate line GL may be insulated from the data line DL by the first insulation layer 120.

The first insulation layer 120 may have a single-layered or multi-layered structure. The first insulation layer 120 may include silicon nitride (SiNx), silicon oxide (SiOx), etc.

For example, the first insulation layer 120 may have a single-layered structure of silicon nitride. In an exemplary embodiment of the invention, the first insulation layer has a thickness of about 500 Å to about 5,000 Å. In an exemplary embodiment of the invention, the first insulation layer 120 includes a first insulating material such as silicon nitride and has a thickness of about 4,000 Å.

Alternatively, the first insulation layer 120 may have a multi-layered structure of a lower first insulation layer and an upper first insulation layer. The lower first insulation layer may be formed on the base substrate 110 and the upper first insulation layer may be formed on the lower first insulation layer. In an exemplary embodiment of the invention, the lower first insulation layer includes silicon nitride and the upper first insulation layer includes silicon oxide. In an exemplary embodiment of the invention, the lower first insulation layer has a thickness of about 500 Å to about 4,000 Å and the upper first insulation layer has a thickness of about 500 Å to about 2,000 Å.

A data metal pattern including the data line DL may be provided on the first insulation 120. In particular, the active pattern AP, the ohmic contact layer OC, the source electrode SE and the drain electrode DE may be provided on the first insulation layer 120.

The second insulation layer 130 may be provided on the first insulation layer 120 to cover the drain electrode DE and the common line CL.

The second insulation layer 130 may have a multi-layered structure. The second insulation layer 130 may include the same material as the first insulation layer 120. The second insulation layer 130 may include silicon nitride (SiNx), silicon oxide (SiOx), etc.

In an exemplary embodiment of the invention, the second insulation layer 130 has a multi-layered structure of a lower second insulation layer 132 and an upper second insulation layer 134. The lower second insulation layer 132 and the upper second insulation layer 134 may be sequentially formed to cover the source electrode SE and the drain electrode DE.

In an exemplary embodiment, the lower second insulation layer 132 includes a second insulating material such as silicon oxide, and the upper second insulation layer 134 includes the first insulating material such as silicon nitride. Accordingly, the first insulation layer 120 may substantially the same material as the upper second insulation layer 134. In an exemplary embodiment of the invention, the first insulation layer 120 and the upper second insulation layer 134 have an etch selectivity with respect to the lower second insulation layer 132. In an exemplary embodiment of the invention, the lower second insulation layer has a thickness of about 500 Å to about 2,000 Å and the upper second insulation layer has a thickness of about 500 Å to about 2,000 Å.

The organic insulation layer 140 may be provided on the second insulation layer 130. The pixel electrode PE and the common electrode CE may be provided on the organic insulation layer 140.

The pixel electrode PE may extend in parallel with the data line DL. In an exemplary embodiment of the invention, the pixel electrode PE is electrically connected to the drain electrode DE through the first contact hole CTH1. Accordingly, a data voltage may be applied to the pixel electrode PE from the data line DL.

The common electrode CE may be arranged adjacent to the switching element SW. In an exemplary embodiment of the invention, the common electrode CE is provided on the pixel electrode PE and overlaps with the pixel electrode PE. In an exemplary embodiment, the common electrode CE is insulated from the pixel electrode PE by the third insulation layer 150.

In an exemplary embodiment, the common electrode CE is electrically connected to the common line CL through the second contact hole CTH2. Accordingly, a common voltage may be applied to the common electrode CE from the common line CL.

As illustrated in FIGS. 3 and 4, in at least one exemplary embodiment of the inventive concept, the upper second insulation layer 134 and the lower second insulation layer 132 on the drain electrode DE have a first hole H1 and a second hole H2, respectively. Accordingly, in an exemplary embodiment, the first contact hole CTH1 includes the first hole H1 and the second hole H2.

In an exemplary embodiment, the upper second insulation layer 134, the lower second insulation layer 132 and the first insulation layer 120 on the common line CL have a third hole H3, a fourth hole H4 and a fifth hole H5, respectively. Accordingly, in an exemplary embodiment, the second contact hole CTH2 includes the third hole H3, the fourth hole H4 and the fifth hole H5.

In an exemplary embodiment, a sidewall of the first hole H1 has a first inclination angle $\theta 1$, and a sidewall of the second hole H2 has a second inclination angle $\theta 2$ smaller than the first inclination angle $\theta 1$. The inclination angles $\theta 1$ and $\theta 2$ may be relative to a top surface of the drain electrode DE. In an exemplary embodiment, a second sidewall of the first hole H1 that opposes the sidewall of the first hole H1 with a right slant has the same first inclination angle $\theta 1$, but slants to the left. In an exemplary embodiment, a second sidewall of the second hole H2 that opposes the sidewall of the first hole H2 with a right slant has the same second inclination angle $\theta 2$, but slants to the left. In an exemplary embodiment, the first hole H1 has a first width W1, and the second hole H2 has a second width W2 smaller than the first width W1. In an exemplary embodiment, the first hole H1 exposes an upper end portion (P) of the lower second insulation layer 132. Accordingly, a sidewall of the first contact hole CTH1 may have a step portion.

For example, the first inclination angle $\theta 1$ may range from about 60 degrees to about 90 degrees, and the second inclination angle $\theta 2$ may range from about 30 degrees to about 60 degrees.

Additionally, in an exemplary embodiment, a sidewall of the third hole H3 has a third inclination angle $\theta 3$, a sidewall of the fourth hole H4 has a fourth inclination angle $\theta 4$ smaller than the third inclination angle $\theta 3$, and a sidewall of the fifth hole H5 has a fifth inclination angle $\theta 5$ greater than the fourth inclination angle $\theta 4$. The inclination angles $\theta 3$, $\theta 4$, and $\theta 5$ may be relative to a top surface of the common line CL. In an exemplary embodiment, a second sidewall of the third hole H3 that opposes the sidewall of the third hole H3 with a right slant has the same third inclination angle $\theta 3$, but slants to the left. In an exemplary embodiment, a second sidewall of the fourth hole H4 that opposes the sidewall of the fourth hole H4 with a right slant has the same second inclination angle $\theta 4$, but slants to the left. In an exemplary embodiment, a second sidewall of the fifth hole H5 that opposes the sidewall of the fifth hole H5 with a right slant has the same second inclination angle $\theta 5$, but slants to the left. In an exemplary embodiment, the third hole H3 has a third width W3, the fourth hole H4 has a fourth width W4 smaller than the third width W3, and the fifth hole H5 has a fifth width W5 smaller than the fourth width W4.

For example, the third inclination angle $\theta 3$ may range from about 60 degrees to about 90 degrees, the fourth inclination angle $\theta 4$ may range from about 30 degrees to about 60 degrees, and the fifth inclination angle $\theta 5$ may range from about 60 degrees to about 90 degrees.

Hereinafter, a method of manufacturing the display substrate in FIG. 1 according to an exemplary embodiment of the invention will be explained in detail.

FIGS. 5 to 10C are cross-sectional views illustrating a method of manufacturing a display substrate in accordance with an exemplary embodiment of the inventive concept.

Figure 5:
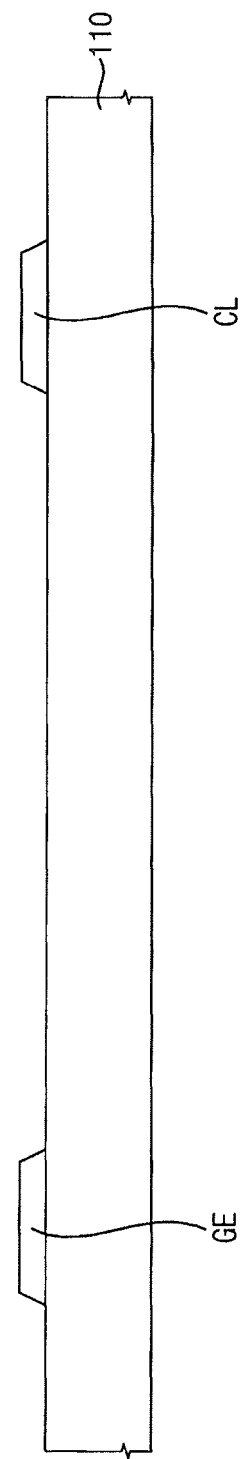

Referring to FIG. 5, a first conductive pattern including a gate electrode GE and a common line CL are formed on a base substrate 110.

In an exemplary embodiment, after a first conductive layer is formed on the base substrate 110, the first conductive layer is patterned to form a gate line GL, the gate electrode GE extending from the gate line GL and the common line CL extending substantially in parallel with the gate line GL. Although it is not illustrated in the figures, a storage line may be further formed on the base substrate 110.

For example, the base substrate 110 may include a glass substrate, a quartz substrate, a silicon substrate, a plastic substrate, etc. The first conductive layer may include elements such as copper (Cu), silver (Ag), chrome (Cr), molybdenum (Mo), aluminum (Al), titanium (Ti), manganese (Mn), aluminum (Al), etc. The first conductive layer may include these elements alone or in a mixture thereof. The first conductive layer may have a single-layered structure or a multi-layered structure. The first conductive layer may be formed by a sputtering process. Sputtering is a process whereby atoms are ejected from a solid target material due to bombardment of the target by energetic particles.

Figure 6:
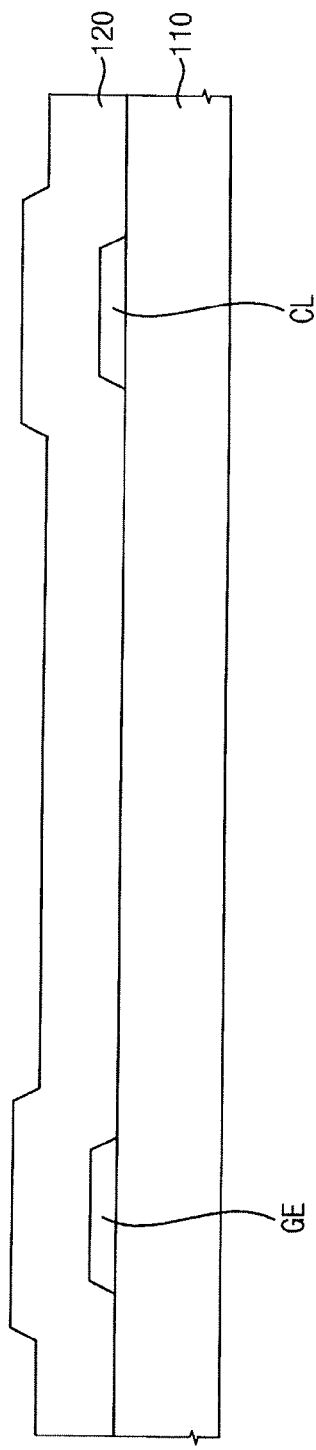

Referring to FIG. 6, a first insulation layer 120 is formed on the base substrate 110 to cover the first conductive pattern.

The first insulation layer 120 may be formed on the base substrate 110 to cover the gate line GL, the gate electrode GE and the common line CL. The first insulation layer 120 may have a single-layered structure or a multi-layered structure. The first insulation layer 120 may include a first insulating material such as silicon nitride (SiNx), silicon oxide (SiOx), etc.

For example, the first insulation layer 120 may include a single-layered structure of silicon nitride. In an exemplary embodiment of the invention, the first insulation layer 120 has a thickness of about 500 Å to about 5,000 Å. In an exemplary embodiment of the invention, the first insulation layer 120 has a thickness of about 4,000 Å.

Alternatively, the first insulation layer 120 may have a multi-layered structure of a lower first insulation layer and an upper first insulation layer. The lower first insulation layer may be formed on the base substrate 110 and the upper first insulation layer may be formed on the lower first insulation layer. In an exemplary embodiment, the lower first insulation layer includes silicon nitride and the upper first insulation layer includes silicon oxide. In an exemplary embodiment, the lower first insulation layer has a thickness of about 500 Å to about 4,000 Å and the upper first insulation layer has a thickness of about 500 Å to about 2,000 Å.

Figure 7:
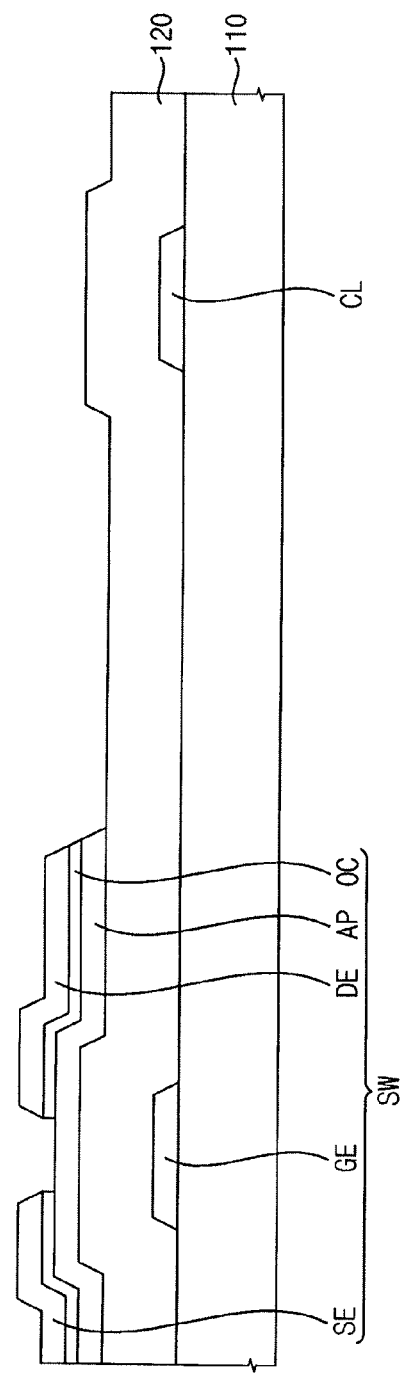

Referring to FIG. 7, a second conductive pattern including a data metal pattern is formed on the first insulation layer 120.

In an exemplary embodiment of the inventive concept, an ohmic contact layer, a semiconductor layer and a data metal layer are formed on the first insulation layer 120, and then, patterned to form an active pattern AP, an ohmic contact layer OC, a source electrode SE and a drain electrode DE overlapping with the gate electrode GE.

For example, the data metal layer may include elements such as copper (Cu), silver (Ag), chrome (Cr), molybdenum (Mo), aluminum (Al), titanium (Ti), manganese (Mn), aluminum (Al), etc. The data metal layer may include these elements alone or in a mixture thereof. The semiconductor layer may include amorphous silicon, polysilicon, oxide semiconductor, etc. In an exemplary embodiment, the semiconductor layer includes amorphous silicon and the ohmic contact layer includes amorphous silicon highly doped with n type impurities.

Figure 8:
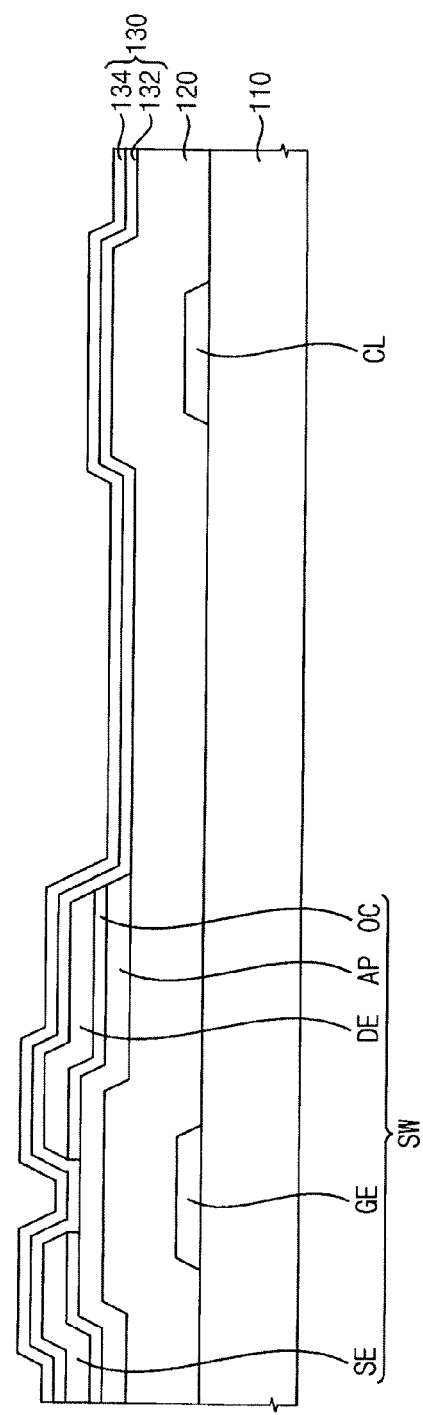

Referring to FIG. 8, a second insulation layer 130 is formed on the first insulation layer 120 to cover the second conductive pattern.

In an exemplary embodiment, the second insulation layer 130 has a multi-layered structure. The second insulation layer 130 may include substantially the same insulating material as the first insulation layer 120. The second insulation layer 130 may include silicon nitride (SiNx), silicon oxide (SiOx), etc.

In an exemplary embodiment, the second insulation layer 130 has a lower second insulation layer 132 and an upper second insulation layer 134. The lower second insulation layer 132 and the upper second insulation layer 134 may be sequentially formed to cover the source electrode SE and the drain electrode DE.

In an exemplary embodiment, the upper second insulation layer 134 includes a first insulating material such as silicon oxide and the lower second insulation layer 132 includes a second insulating material such as silicon nitride. Accordingly, the first insulation layer 120 may include substantially the same material as the upper second insulation layer 134. In an exemplary embodiment, the first insulation layer 120 and the upper second insulation layer 134 have an etch selectivity with respect to the lower second insulation layer 132. In an exemplary embodiment, the lower second insulation layer has a thickness of about 500 Å to about 2,000 Å and the upper second insulation layer has a thickness of about 500 Å to about 2,000 Å.

Referring to FIGS. 9 and 10A to 10C, the second insulation layer 130 is patterned to form a first contact hole CTH1 that exposes the drain electrode DE and the second insulation layer 130 and the first insulation layer 120 is patterned to form a second contact hole CTH2 that exposes the common line CL.

Figure 9:
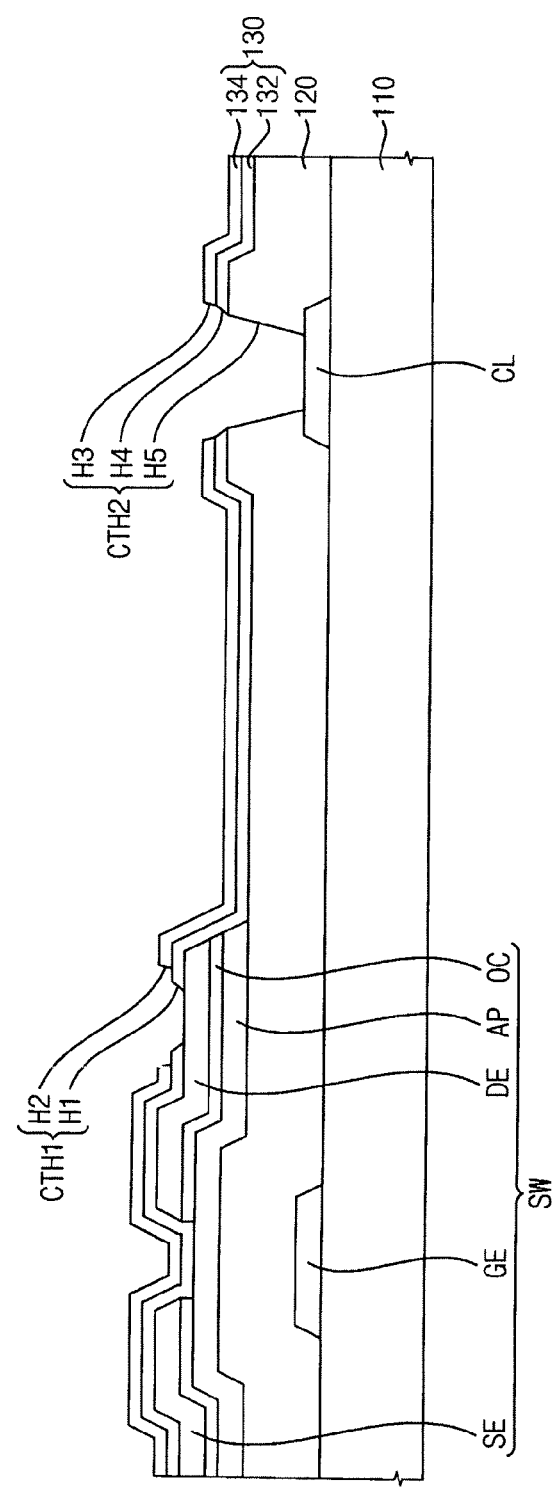
Figure 10A:
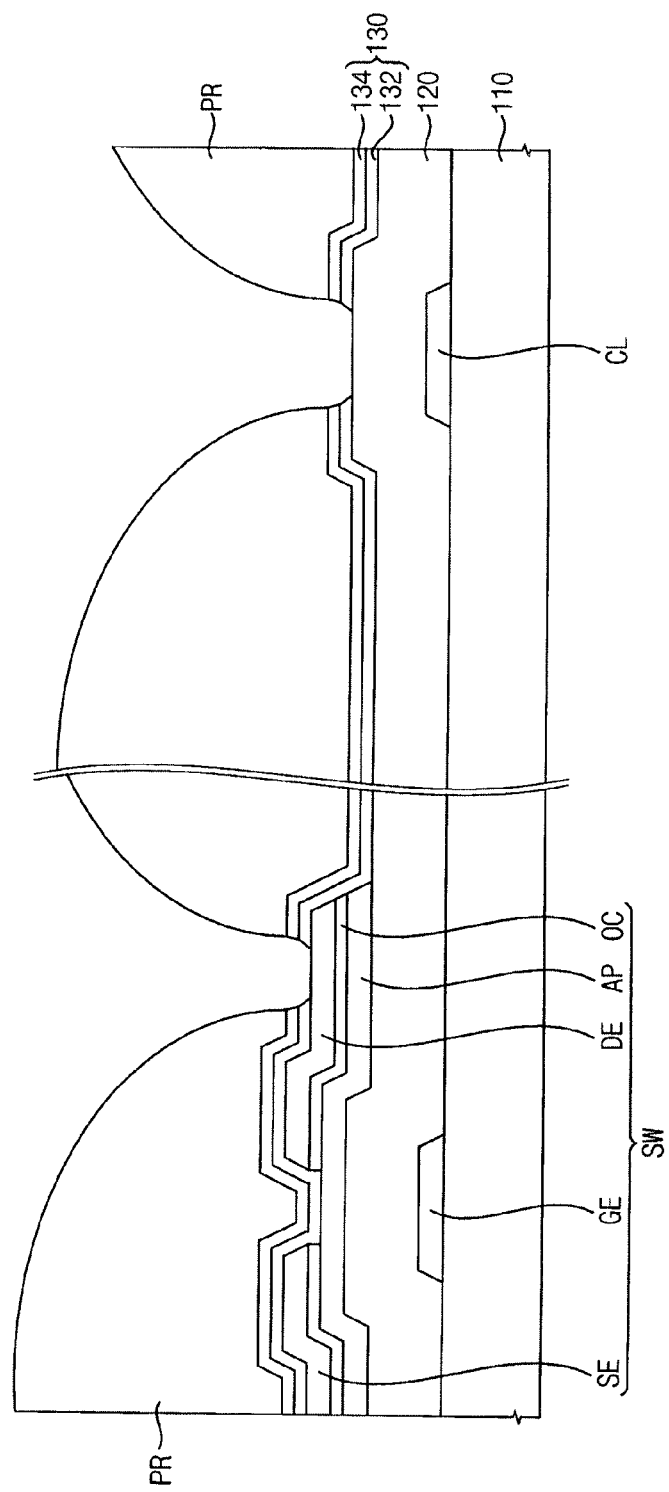
Figure 10B:
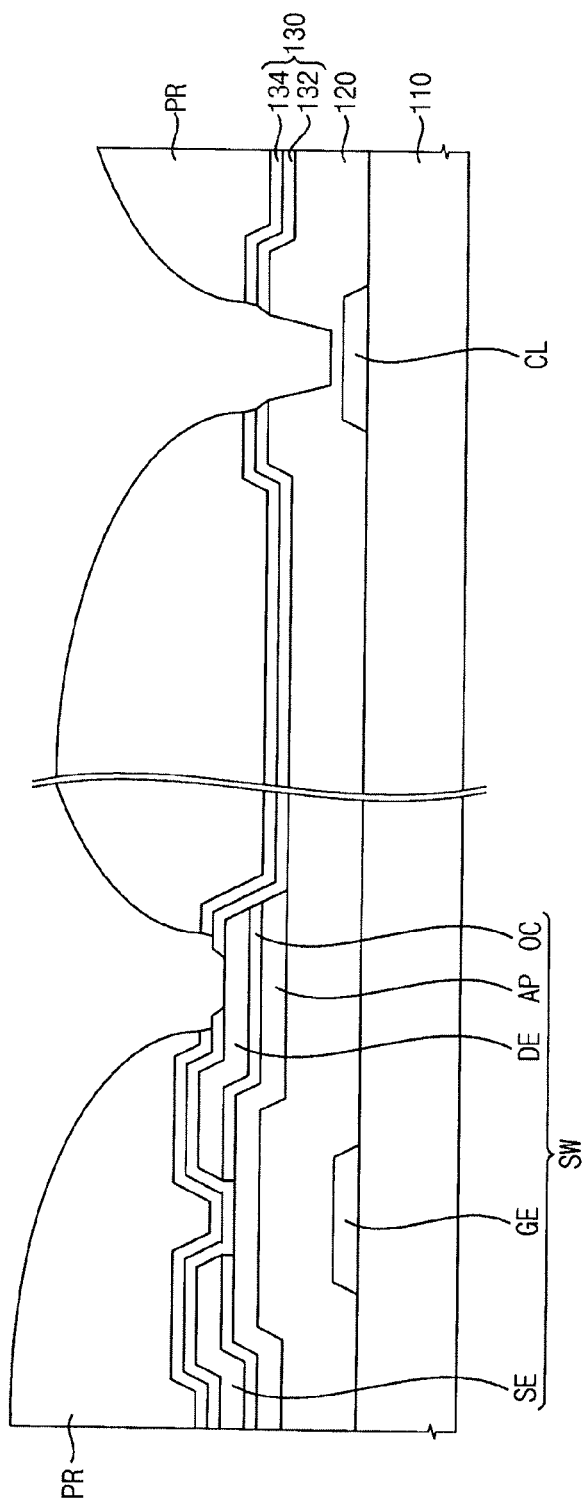
Figure 10C:
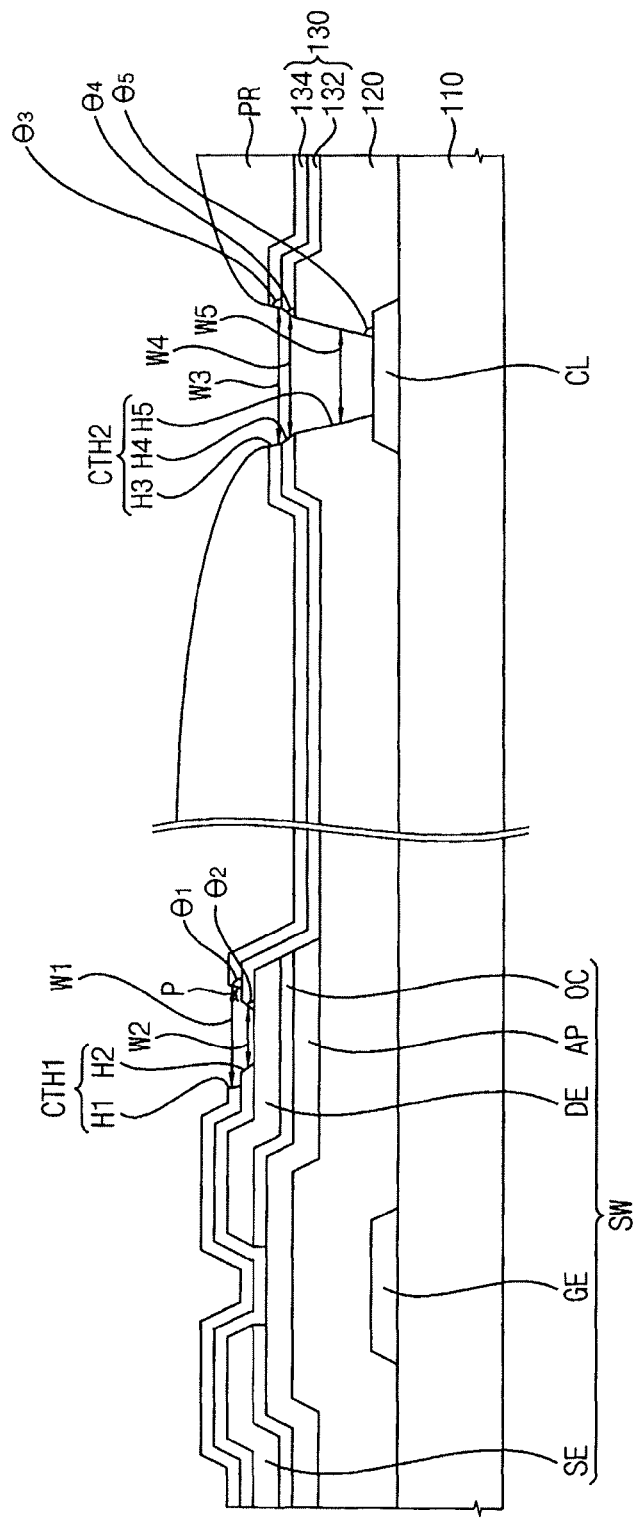

FIGS. 10A to 10C are cross-sectional views illustrating first to third etching processes of forming the first and second contact holes in FIG. 9.

As illustrated in FIG. 10A, a first etching process is performed to form a first preliminary contact hole in the second insulation layer 130.

For example, a photoresist layer is formed on the second insulation layer 130 and then patterned to form a photoresist pattern PR having openings that expose portions of the underlying insulation layer 120 where the first contact hole CTH1 and the second contact hole CTH2 are formed. A photoresist is a light-sensitive material, where a portion of the photoresist that is exposed to light may become soluble to a photoresist developer. As an example, a sidewall of the opening may have an inclination angle of about 85 degrees. Then, the second insulation layer 130 is patterned using the photoresist pattern PR as an etching mask until the drain electrode DE is exposed.

The first etching process may be a plasma etching process. The first etching process may be controlled by varying a pressure, a temperature, a power, an etching gas or the like of the plasma etching process. For example, the power applied to the process chamber may be increased to control a directionality of etching ion gases in the first etching process, such that the etching ion gases proceeds in a direction substantially perpendicular to the second insulation layer 130. The etching gas may include $NF_3/O_2$, $SF_6/O_2$, $NF_3/O_2/Ar$, etc.

In an exemplary embodiment of the invention, in the first etching process, the etch selectivity between the first insulating material and the second insulating material is controlled such that the lower second insulation layer 132 including the second insulating material has a relatively higher etching rate.

Accordingly, in an exemplary embodiment of the invention, the first etching process is an anisotropic etching process or a dry etching process. The first preliminary contact hole of the second insulation layer 130 formed by the first etching process may have a sidewall with a relatively larger inclination angle.

The first etching process may be performed such that the drain electrode DE is exposed and the first insulation layer 120 on the common line CL is exposed.

As illustrated in FIG. 10B, a second etching process is performed using the photoresist pattern PR as an etching mask to form a second preliminary contact hole in the second insulation layer 130 and the first insulation layer 120. The second etching process may have process conditions different from the first etching process.

In an exemplary embodiment, in the second etching process, the etch selectivity of the first insulation layer 120 is controlled such that the first insulation layer 120 including the first insulating material has a relatively higher etching rate. For example, the process conditions of the second etching process may be controlled such that an etch selectivity (e.g., etching rate) of the first insulating material with respect to the second insulating material in the second etching process is higher than that in the first etching process. That is, in an exemplary embodiment of the invention, an etching rate of the first insulating material in the second etching process is higher than an etching rate of the first insulation material in the first etching process.

Additionally, the power applied to the process chamber in the second etching process may be decreased as compared with the first etching process such that a directionality of etching ion gases in the second etching process is lower than that in the first etching process.

Accordingly, in an exemplary embodiment of the invention, the second etching process is an isotropic etching process. Isotropic etching is non-directional removal of material from a substrate via chemical process using an etchant substance. The etching rates of the upper second insulation layer 134 and the first insulation layer 120 including the first insulating material may be increased as compared with the first etching process. Thus, the upper second insulation layer 134 may be etched relatively quickly so that the second preliminary contact hole formed in the second insulation layer by the second etching process has a sidewall with a step portion.

Further, the second etching process may have a directionality of etching ion gases lower than the first etching process. Accordingly, if a metallic polymer fence is formed on a sidewall of the opening of the photoresist pattern PR during the first etching process, the fence is removed during the second etching process.

The second insulation layer 130 and the first insulation layer 120 may be patterned by the second etching process until the common line CL is exposed.

As illustrated in FIG. 10C, a third etching process is performed to form a first contact hole CTH1 and a second contact hole CTH2 in the second insulation layer 130 and the first insulation layer 120. The third etching process may have process conditions different from the second etching process.

The third etching process may be performed to improve a sidewall profile of the second preliminary contact hole. For example, the third etching process may have a relatively higher etching rate of the first insulating material. In an exemplary embodiment, the third etching process has an oxygen ($O_2$) gas concentration greater than the second etching process.

As illustrated in FIGS. 9 and 10C, the upper second insulation layer 134 and the lower second insulation layer 132 on the drain electrode DE have a first hole H1 and a second hole H2, respectively. Accordingly, the first contact hole CTH1 includes the first hole H1 and the second hole H2.

The upper second insulation layer 134, the lower second insulation layer 132 and the first insulation layer 120 on the common line CL have a third hole H3, a fourth hole H4 and a fifth hole H5, respectively. Accordingly, the second contact hole CTH2 includes the third hole H3, the fourth hole H4 and the fifth hole H5.

In an exemplary embodiment, a sidewall of the first hole H1 has a first inclination angle $\theta 1$, and a sidewall of the second hole H2 has a second inclination angle $\theta 2$ smaller than the first inclination angle $\theta 1$. In an exemplary embodiment, the first hole H1 has a first width W1, and the second hole H2 has a second width W2 smaller than the first width W1. The first hole H1 exposes an upper end portion (P) of the lower second insulation layer 132. Accordingly, a sidewall of the first contact hole CTH1 has a step portion.

For example, the first inclination angle $\theta 1$ may range from about 60 degrees to about 90 degrees, and the second inclination angle $\theta 2$ may range from about 30 degrees to about 60 degrees.

Additionally, in an exemplary embodiment, a sidewall of the third hole H3 has a third inclination angle $\theta 3$, a sidewall of the fourth hole H4 has a fourth inclination angle $\theta 4$ smaller than the third inclination angle 3, and a sidewall of the fifth hole H5 has a fifth inclination angle $\theta 5$ greater than the fourth inclination angle $\theta 4$. In an exemplary embodiment, the third hole H3 has a third width W3, the fourth hole H4 has a fourth width W4 smaller than the third width W3, and the fifth hole H5 has a fifth width W5 smaller than the fourth width W4.

For example, the third inclination angle $\theta 3$ may range from about 60 degrees to about 90 degrees, the fourth inclination angle $\theta 4$ may range from about 30 degrees to about 60 degrees, and the fifth inclination angle $\theta 5$ may range from about 60 degrees to about 90 degrees.

Referring again to FIG. 2, an organic insulation layer 140 is formed on the second insulation layer 130, and then, the organic insulation layer 140 is patterned to form holes that correspond to the first and second contact holes CTH1 and CTH2 respectively.

In an exemplary embodiment, a transparent conductive layer is formed on the organic insulation layer 140. The transparent conductive layer may include materials such as indium zinc oxide, indium tin oxide, etc. The transparent conductive layer may include these materials alone or in a mixture thereof. The transparent conductive layer may be patterned to form a pixel electrode PE. The pixel electrode PE is electrically connected to the drain electrode DE through the first contact hole CTH1.

In an exemplary embodiment, after a third insulation layer 150 is formed on the pixel electrode PE, a transparent conductive layer is formed on the third insulation layer 150.

The transparent conductive layer may include materials such as indium zinc oxide, indium tin oxide, etc. The transparent conductive layer formed on the pixel electrode PE may include these materials alone or in a mixture thereof. In an exemplary embodiment, the transparent conductive layer formed on the pixel electrode PE is patterned to form a common electrode CE. The common electrode CE is electrically connected to the common line CL through the first contact hole CTH1.

As mentioned above, multi-step etching processes may be performed to form the first contact hole CTH1 in the second insulation layer 130 having a first height from the drain electrode DE and the second contact hole CTH2 in the first and second insulation layers 120 and 130 having a second height greater than the first height from the common line CL. For example, as shown in FIG. 2, the depth of the second contact hole CTH2 is greater than the depth of the first contact hole CTH1.

Further, the first etching process of the multi-step etching processes may be performed to expose the drain electrode DE, and then the second etching process may be performed to expose the common line CL as well as to remove the fence formed on the sidewall of the opening of the photoresist pattern during the first etching process, thereby improving reliability of a display device.

The display substrate may be used for an array substrate of a liquid crystal display device. For example, the display substrate may face another substrate and a liquid crystal layer may be interposed between the display substrate and other substrate. However, the display device may be used for a display device and an electronic device such as an organic EL display, a circuit board including a thin film transistor, a semiconductor device, or the like.

The foregoing is illustrative of exemplary embodiments of the invention and is not to be construed as limiting thereof. Although a few exemplary embodiments have been described, those skilled in the art will readily appreciate that many modifications are possible in the exemplary embodiments without materially departing from the present invention. Accordingly, all such modifications are intended to be included within the scope of the invention.

What is claimed is:

1. A method of manufacturing a display substrate, the method comprising:
    forming a common line on a base substrate;
    forming a first insulation layer on the base substrate to cover the common line, the first insulation layer having a first insulating material;
    forming a conductive pattern on the first insulation layer, the conductive pattern including a source electrode and a drain electrode;
    forming a second insulation layer on the first insulation layer to cover the drain electrode and the common line, the second insulation layer including a lower second insulation layer having a second insulating material and an upper second insulation layer having the first insulating material;
    performing a first etching process on the second insulation layer on the common line and the drain electrode until the drain electrode is exposed; and
    performing a second etching process on the second and first insulation layers on the common line and the drain electrode to form a first contact hole exposing the drain electrode and a second contact hole exposing the common line, wherein an etching rate of the first insulating material in the second etching process is higher than an etching rate of the first insulation material in the first etching process.

2. The method of claim 1, wherein the first insulating material comprises silicon nitride and the second insulating material comprises silicon oxide.

3. The method of claim 1, wherein an etch selectivity of the first insulating material with respect to the second insulating material in the second etching process is higher than that in the first etching process.

4. The method of claim 1, wherein the first etching process comprises an anisotropic etching process and the second etching process comprises an isotropic etching process.

5. The method of claim 1, wherein the first and second etching processes comprise a plasma ion etching process.

6. The method of claim 1, further comprising a third etching process for controlling sidewall profiles of the first and second contact holes.

7. The method of claim 1, wherein the upper second insulation layer and the lower second insulation layer on the drain electrode have a first hole and a second hole respectively that form the first contact hole, the first hole exposes an upper end portion of the lower second insulation layer, and a sidewall of the first contact hole has a step portion.

8. The method of claim 7, wherein a sidewall of the first hole has a first inclination angle and a sidewall of the second hole has a second inclination angle smaller than the first inclination angle.

9. The method of claim 7, wherein the upper second insulation layer, the lower second insulation layer and the first insulation layer on the common line have a third hole, a fourth hole and a fifth hole respectively that form the second contact hole.

10. The method of claim 9, wherein a sidewall of the third hole has a third inclination angle, a sidewall of the fourth hole has a fourth inclination angle smaller than the third inclination angle, and a sidewall of the fifth hole has a fifth inclination angle greater than the fourth inclination angle.

* * * * *